United States Patent
Brask et al.

(10) Patent No.: US 7,547,639 B2
(45) Date of Patent: Jun. 16, 2009

(54) SELECTIVE SURFACE EXPOSURE, CLEANS AND CONDITIONING OF THE GERMANIUM FILM IN A GE PHOTODETECTOR

(75) Inventors: Justin K. Brask, Portland, OR (US); Bruce A. Block, Portland, OR (US); Uday Shah, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 435 days.

(21) Appl. No.: 11/369,877

(22) Filed: Mar. 6, 2006

(65) Prior Publication Data
US 2006/0188827 A1 Aug. 24, 2006

Related U.S. Application Data

(62) Division of application No. 10/607,955, filed on Jun. 26, 2003, now Pat. No. 7,078,160.

(51) Int. Cl.
*H01L 21/302* (2006.01)
(52) U.S. Cl. .................. 438/724; 438/700
(58) Field of Classification Search ............. 438/700, 438/702, 706, 710, 714, 723, 724, 725, 745
See application file for complete search history.

(56) References Cited

U.S. PATENT DOCUMENTS

| | | | | |
|---|---|---|---|---|
| 3,609,414 A * | 9/1971 | Pleshko et al. | ............ | 327/543 |
| 3,767,493 A * | 10/1973 | Kump | .................. | 438/750 |
| 5,559,428 A * | 9/1996 | Li et al. | ................ | 324/71.5 |
| 5,759,921 A * | 6/1998 | Rostoker | .............. | 438/711 |
| 5,972,123 A * | 10/1999 | Verhaverbeke | .............. | 134/3 |
| 6,369,008 B1 * | 4/2002 | Ha et al. | ................ | 510/175 |
| 6,645,831 B1 * | 11/2003 | Shaheen et al. | ............ | 438/455 |
| 6,683,007 B1 * | 1/2004 | Yamasaki et al. | ........... | 438/745 |
| 2002/0190269 A1 * | 12/2002 | Atwater et al. | ............ | 257/184 |
| 2003/0125496 A1 * | 7/2003 | Strother et al. | ............ | 527/300 |

* cited by examiner

*Primary Examiner*—Kin-Chan Chen
(74) *Attorney, Agent, or Firm*—Blakely, Sokoloff, Taylor & Zafman LLP

(57) ABSTRACT

A method of protecting a sensitive layer from harsh chemistries. The method includes forming a first sensitive layer, forming a second layer upon the first layer, then forming a third layer over the second layer. The third layer is utilized as a mask during patterning of the second layer. During patterning, however, the second layer is only partially etched, thus leaving a buffer layer overlying the first layer. The third layer is completely removed while the buffer layer protects the first layer from the harsh chemicals that are utilized to remove the third layer. Then, the buffer layer is carefully removed down to the surface of the first layer.

14 Claims, 15 Drawing Sheets

SELECTIVE SURFACE EXPOSURE, CLEANS AND CONDITIONING OF THE GERMANIUM FILM IN A GE PHOTODETECTOR

This is a Divisional application of Ser. No. 10/607,955 filed Jun. 26, 2003, and issued as U.S. Pat. No. 7,078,160 on Jul. 18, 2006.

FIELD

The present invention relates generally to the field of semiconductor technology and, more specifically, to etching and cleaning sensitive materials.

BACKGROUND

In the semiconductor fabrication arts, it is often necessary to fashion (etch, pattern, etc.) layers of differing materials according to a given design to create electronic devices, interconnections, or other structures in an integrated circuit. Photolithography is commonly used to create patterns within the layers of an integrated circuit. FIG. 1A-1C illustrates a typical photolithography process. As shown in FIG. 1A, a photoresist material 1 is deposited atop a first layer 2 that is to be etched. Layer 2 may overlay any number of other layers, for example, layer 3. According to well known masking, exposing, and developing techniques, the photoresist material 1 is patterned to create an opening 4. Layer 2 may then be etched through the opening, such as by a reactive ion etch (RIE), shown in FIG. 1B. The RIE utilizes an etchant 5 that etches the material of layer 2, more selectively than the photoresist material 1. Hence, the photoresist material 1 holds its form during the etch and a cavity 8 can be formed into layer 2 according to the patterned opening 4. At the same time, the etchant 5 that etches layer 2, does so at a much higher rate than it etches the material of underlying layer 3, hence the underlying layer 3 acts as an etch stop.

Typically, after forming the cavity 8 in layer 2, the photoresist material 1 needs to be removed to enable further processing of layer 2 or layer 3. Consequently, as shown in FIG. 1C, the photoresist material 1 may be removed according to the similar etching methods, such as RIE, $O_2$ high pressure ashing, and/or well-known wet cleaning techniques. Layer 2 and layer 3 are typically durable semiconductive, insulative, or conductive materials that are conventionally used in integrated circuits, so that during the removal of the photoresist material 1, layers 2 and 3 do not typically have to be protected when the photoresist material 1 is being removed. Additionally, the oxygen plasma damage from RIE is very minimal on these types of materials. Examples of durable materials may include silicon, silicon oxide, silicon nitride, polysilicon, and other materials that are durable to chemistries that remove conventional photoresist materials. As a result, the photoresist material 1, has, until now, been removed without fear of damaging underlying thin films or structures.

However, modern technologies are rapidly exploring the use of new and different materials that have not typically been used in the formation of integrated circuits. These new and different materials may include materials that are sensitive to chemistries that, until now, have not presented problems. For example, germanium has been proposed to replace silicon as a semiconductor of choice for many fabrication processes that heretofore have used silicon. Germanium, however, tends to be very sensitive to certain chemistries, for example, the dry and wet chemistries utilized to remove photoresist materials. Consequently, previous methods of removing certain materials, such as photoresist, require new and unique techniques in order to maintain the integrity of new and different materials, such as germanium.

BRIEF DESCRIPTION OF THE DRAWINGS

Embodiments of the present invention are illustrated by way of example and should not be limited by the figures of the accompanying drawings in which like references indicate similar elements and in which.

DETAILED DESCRIPTION

Described herein is a method of etching and cleaning a sensitive layer in the formation of semiconductive structures, integrated circuitry, and other generally related electronic devices. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well known semiconductor fabrication processes, techniques, materials, equipment, etc., have not been set forth in particular detail in order to not unnecessarily obscure embodiments of the present invention.

Described herein is a method of protecting a sensitive layer from harsh chemistries. In brief, the method includes forming a first sensitive layer, forming a second layer upon the first layer, then forming a third layer over the second layer. The third layer is utilized as a mask during patterning of the second layer. During patterning, however, the second layer is only partially etched, thus leaving a buffer layer overlying the first layer. The third layer is completely removed while the buffer layer protects the first layer from the harsh chemicals that are utilized to remove the third layer. Then, the thinned portion of the buffer layer is carefully removed down to the surface of the first layer.

Figure 1A:
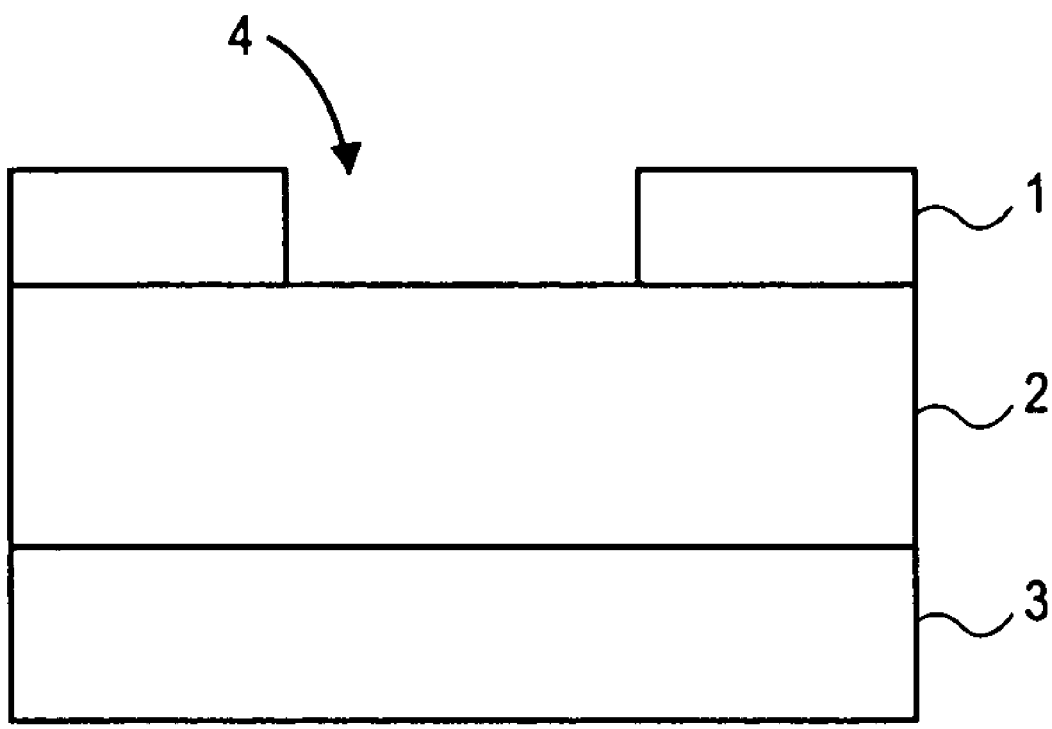
FIG. 1A-1C illustrates a typical photolithography process.
Figure 1B:
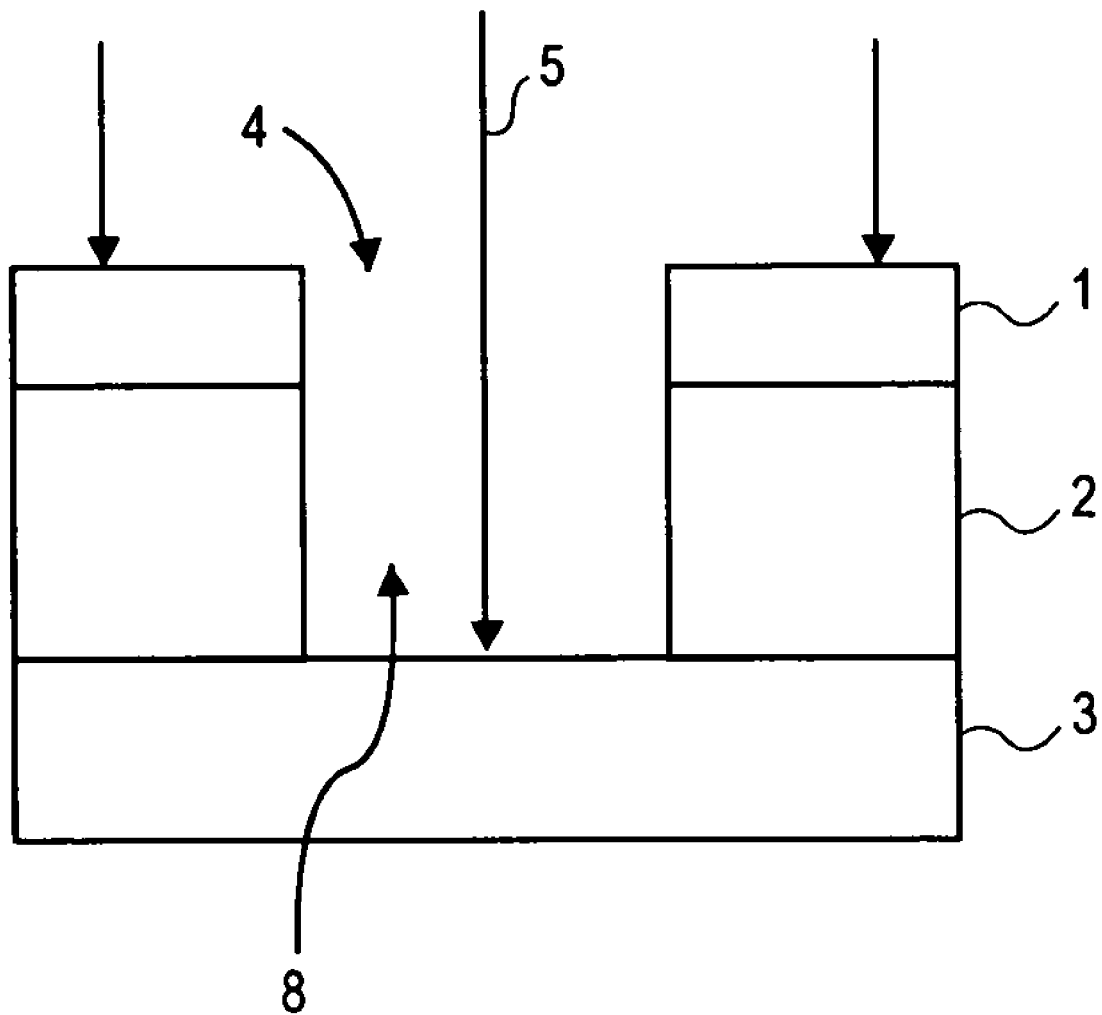
Figure 1C:
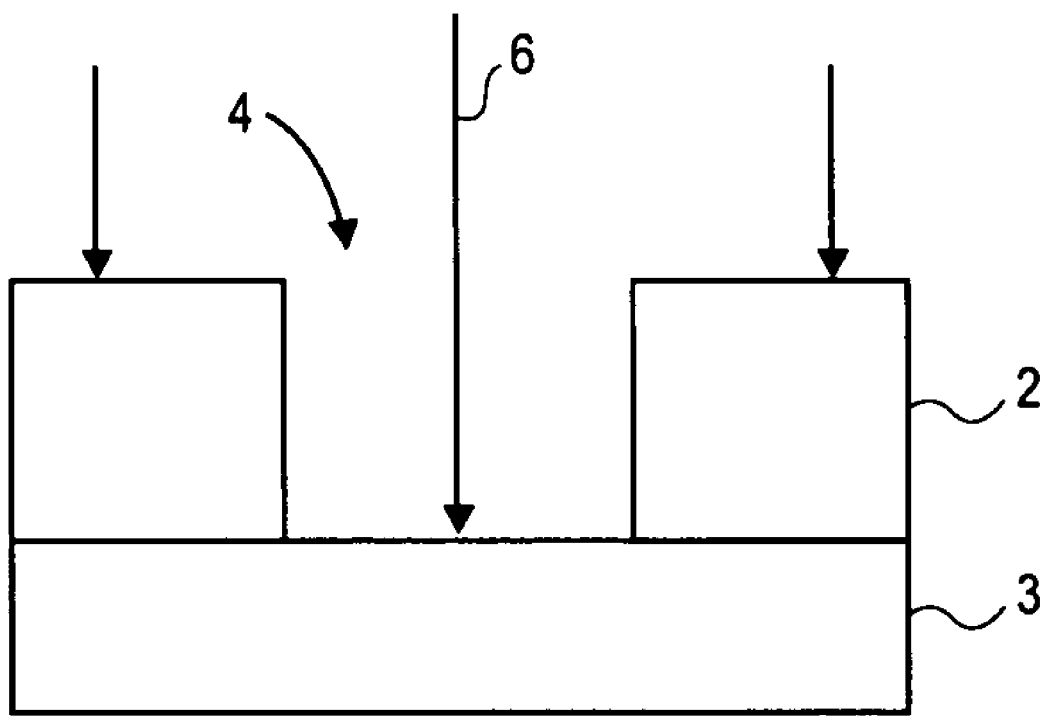
Figure 2A:
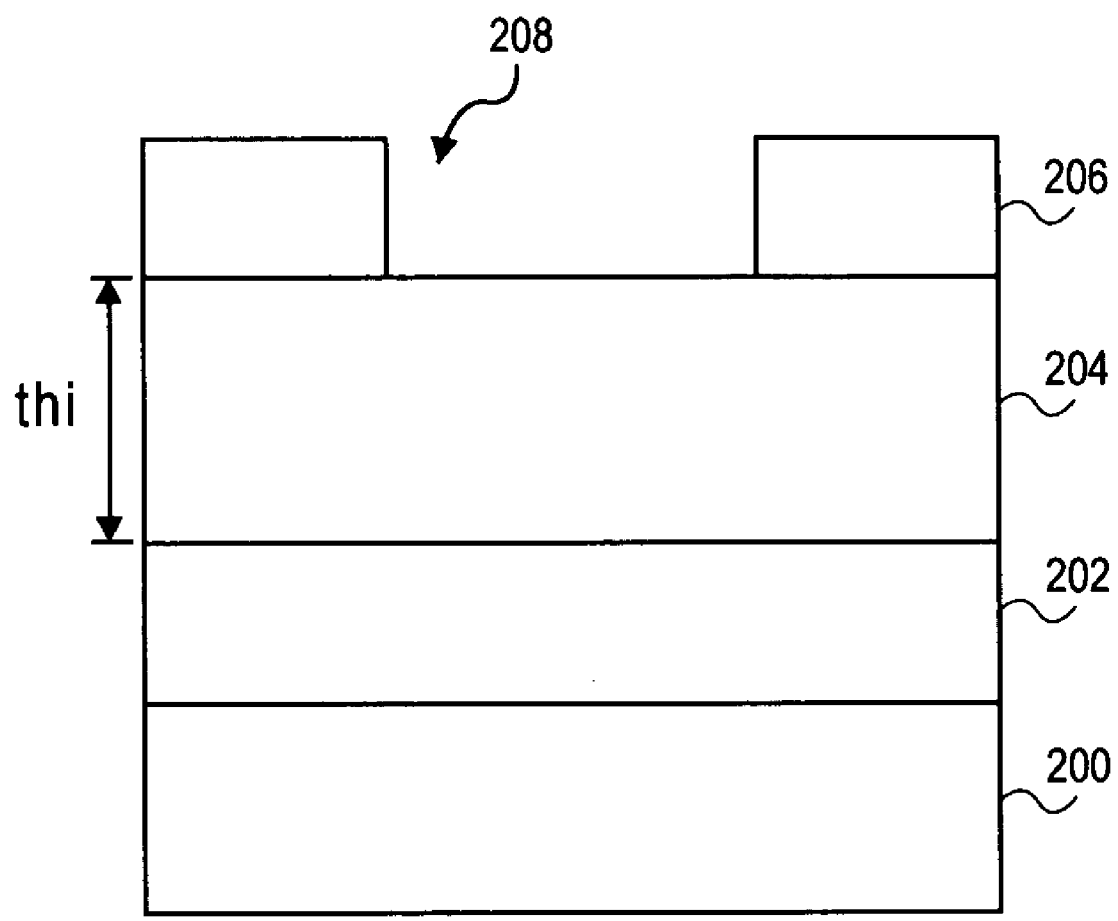
FIG. 2A-2D illustrate a method according to one embodiment of the invention, of removing a layer of patterning material without damaging an underlying sensitive material.

FIG. 2A-2D illustrate a method according to one embodiment of the invention, of removing a layer of patterning material without damaging an underlying sensitive material. Referring to FIG. 2A, the method begins with forming a first layer 202 over a substrate 200, forming a second layer 204 over the first layer 202 and forming a third layer 206 over the second layer 204. The third layer 206 is patterned to have an opening 208 therein. The pattern of the opening 208 will subsequently be transferred to the underlying second layer 204.

The first layer 202 comprises a very sensitive semiconductor material that is susceptive to damage from harsh chemistries ("first chemistry") utilized during the patterning and removal of the third layer 206. The term "sensitive" means that the material composition of the first layer 202 is easily etchable, removable, corruptible, or in other words, will undergo a severe material alteration if exposed directly to chemical compounds and/or solutions that comprise the first chemistry. Hence, the material of the first layer 202 and the chemical composition of the first chemistry can vary depending on the process. For example, in the formation of a semiconductor photodector device, one example of a sensitive material may include germanium, which is utilized to form the optical layer of the photodector. In other examples, such as in the formation of some transistors, sensitive materials may include III-V semiconductor compounds, such as gallium arsenide, aluminum nitride, or indium antiminide.

Still referring to FIG. 2A, the second layer 204, formed over the first layer 202, is not sensitive to the first chemistry previously described. The second layer 204 may be a nitride, an oxide, an oxynitride, or any other material that is formed over the first, sensitive layer. For example, in one embodiment of the invention, the second layer 204 may be an insulating layer to insulate the first layer 202 from other materials within an integrated circuit. In another embodiment, the second layer 204 may be a conductive or semiconductive material that will be utilized in conjunction with the first layer 202 to form an active device, such as an electrode of an electronic device. In other embodiments of the invention, the second layer 204 may also include multiple layers of different materials that overlie the first, sensitive layer. For example, the second layer 204 may include a nitride overlying a pad oxide. The second layer 204 may alternatively comprise an oxide/nitride/oxide composite. Hence, the actual composition of the material of the second layer 204 may vary. However, the second layer 204 should comprise at least one material that is not sensitive to the harsh chemicals of the first chemistry that will be utilized in the patterning, and removal, of an overlying third layer 206, such as a photoresist layer 206. For simplicity of disclosure, the second layer 204 may be referred to herein as a "non-sensitive" layer, that "directly overlies" the sensitive layer, although one ordinarily skilled in the art may recognize that the second layer 204 may comprise more than one material or layers of materials.

The thickness of the second layer 204 may vary depending on the desired process. However, in one embodiment of the invention, the second layer 204 should be formed thick enough to protect the first layer 202 from the harsh, first chemistry. In other words, the second layer 204 should be formed to a thickness that will withstand dry or wet etching of the second layer 204, when an overlying third layer 206 is being patterned, cleaned, or otherwise processed.

Still referring to FIG. 2A, the third layer 206 is formed directly on top of the second layer 204. The third layer 206 is removable by the first, "harsh" chemistry. In one embodiment of the invention, third layer 206 may be a photoresist material, or other type of material, used to protect portions of the second layer 204 from being etched during a photolithography process. In another embodiment of the invention, the third layer 206 may instead be a hardmask material.

As described above, the third layer 206 is formed to have an opening 208. The opening 208 is formed according to a designed width. In one embodiment of the invention, a typical photolithography process may include the well-known techniques of masking, exposing, and developing the third layer 206 to form the opening 208. The pattern of the opening 208 will subsequently be transferred to the underlying second layer 204.

Figure 2B:
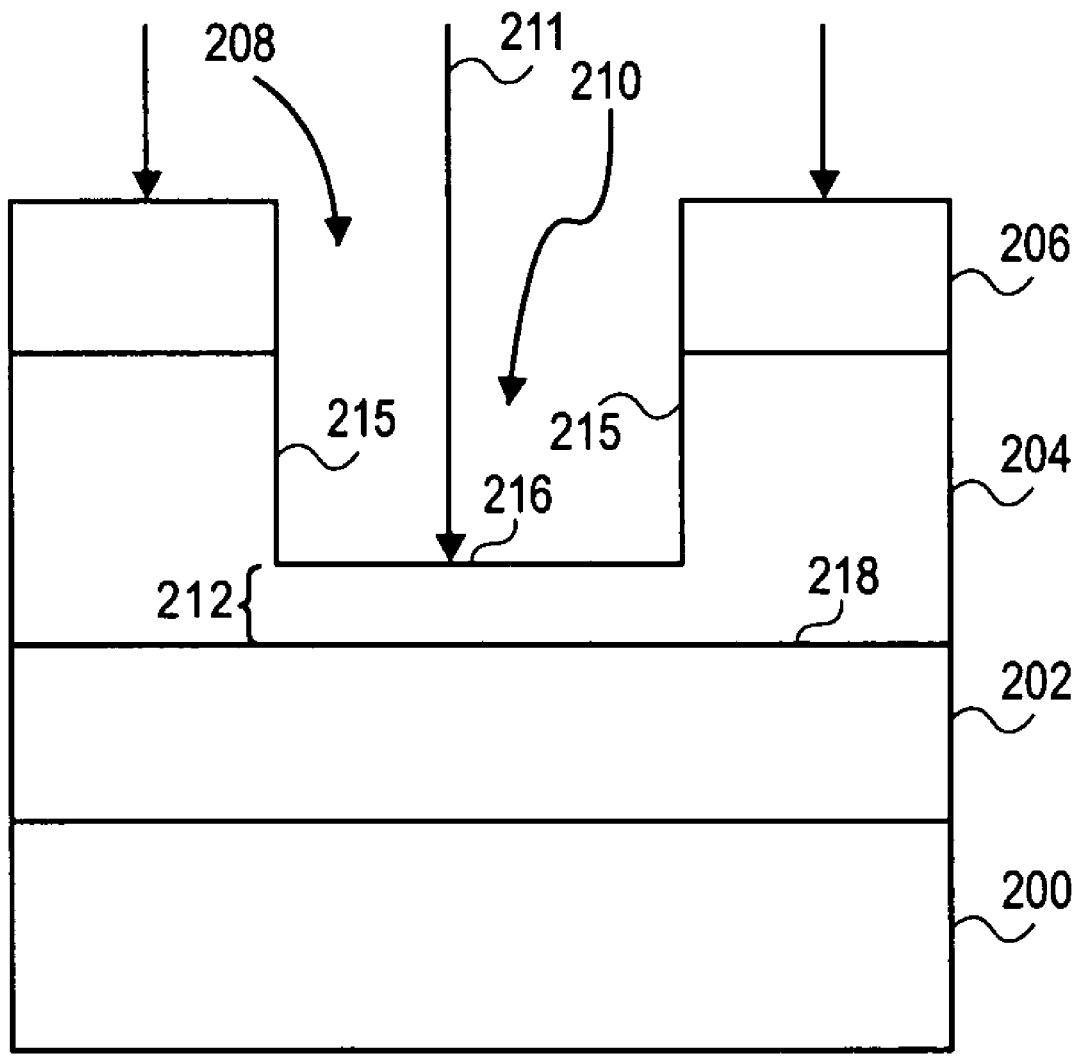

Next, as shown in FIG. 2B, the method continues with substantially etching the thickness of the second layer 204 through the opening 208, but leaving a thin, unetched portion of the second layer 204 on the first layer 202. A substantial portion of the second layer 204's thickness is removed in a substantially vertical fashion, to form a hole, or via 210, inside the second layer 204 having sidewalls 215 and a bottom 216. The buffer layer 212, between the bottom 216 of the via 210 and the top surface 218 of the first layer 202, is approximately 10% to 25% of the original thickness of the second layer 204, and may herein be termed a "buffer layer" 212, since it will function as a buffer between the bottom 216 of the via 210 and the top surface 218 of the first layer 202, during the subsequent removal of the third layer 206. The formation of the via 210 may be accomplished by performing a timed dry etch of the second layer 204 through the opening 208. The timed etch is calculated to remove approximately 75%-90% of the second layer 204. Dry etching techniques are well known in the art and may include such techniques as plasma etching, or reactive ion etching, which may utilize ions 211 of a second chemistry that etches the second layer 204, but that does not substantially etch the third layer 206.

Figure 2C:
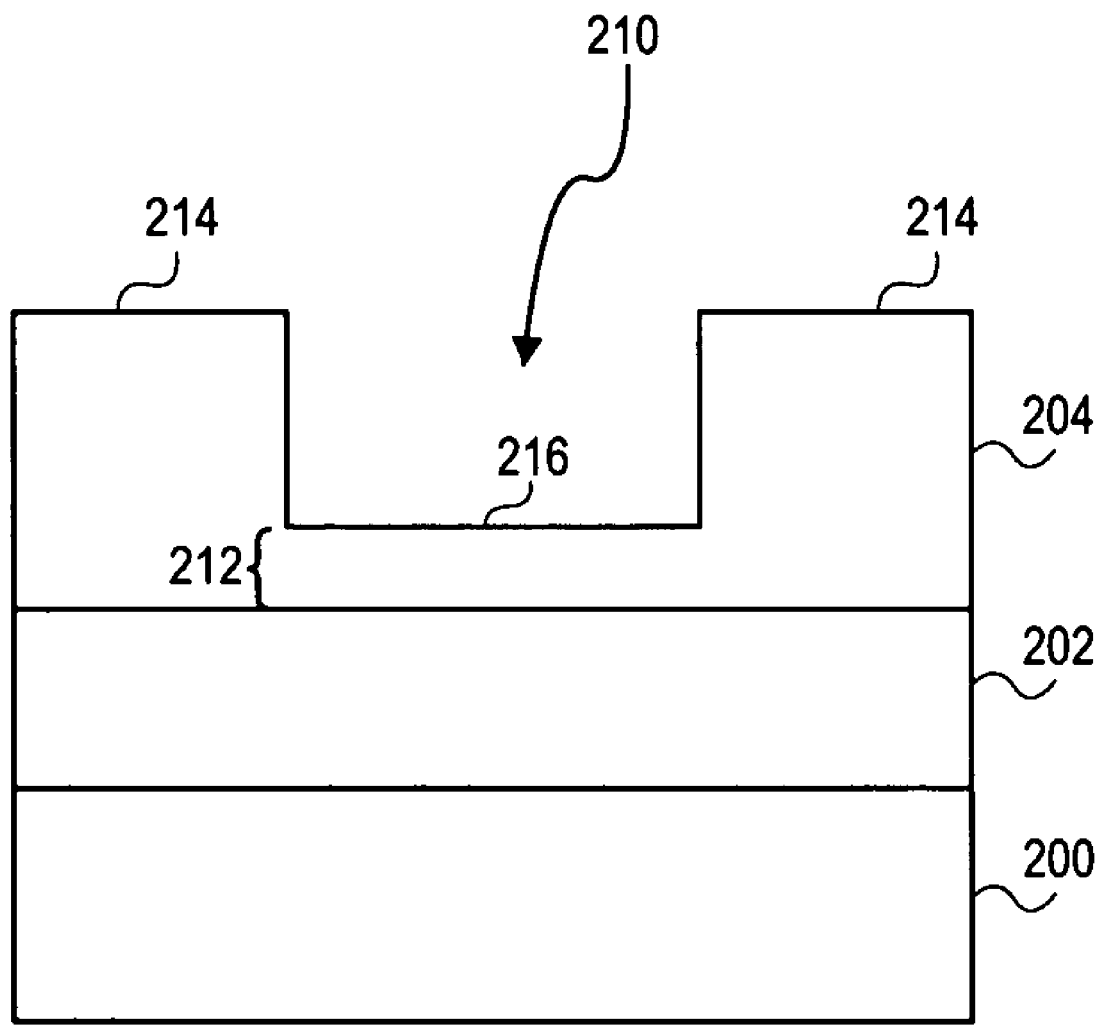

Next, as shown in FIG. 2C, the method continues with removing the third layer 206 using the previously mentioned first chemistry. During the removal of the third layer 206, the buffer layer 212 protects the first layer 202 from the first chemistry. If not for the buffer layer 212, the first layer 202 would be damaged by the harsh, first chemistry. However, because the buffer layer 212 is in place, the first layer 202 is spared from the potential damage that would occur from the first chemistry. During the removal of the third layer 206, the buffer layer 212 may undergo a partial etching. Hence, the thickness of the buffer layer 212 should be thick enough to withstand partial etching, yet still have a substantial portion of mass to still protect the first layer 202 throughout the entire time that the third layer 206 is being removed, including any wet cleaning/ashing procedures.

Figure 2D:
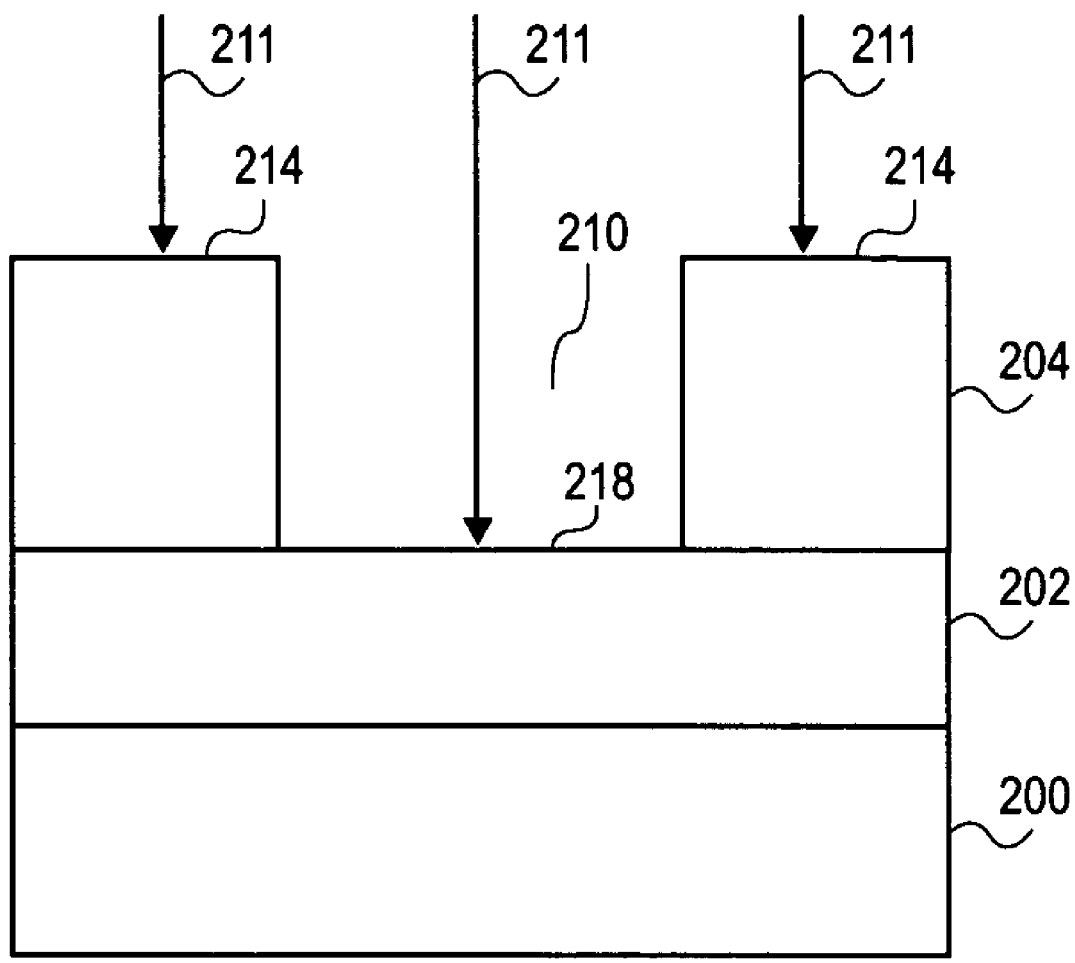

Next, as shown in FIG. 2D, after the third layer 206 has been removed and cleaned, the method continues with removing the buffer layer 212 with a chemistry to which the first layer 202 is not significantly sensitive. As a result, the first layer 202 can maintain its substantially planar shape, as originally formed. In one embodiment of the invention, the buffer layer 212 may be removed by the same chemistry (i.e., the second chemistry) previously used to etch the second layer 204, as described above in conjunction with FIG. 2B. In addition to using the second chemistry to which the first layer 202 is not significantly sensitive, the removal of the buffer layer 212 may be performed very slowly, in a very controlled fashion, to better control the removal of the buffer layer 212 and ensure that the top surface 218 of the first layer 202 is not damaged.

Additionally, a wet chemistry may be employed to clean any remaining residue of the second layer 204. To minimize the impact of the wet cleaning chemistry on the first layer 202 the wet clean may be performed at room temperature, in very dilute concentrations, and for very brief periods of time. Consequently, the via 210 is extended entirely through the second layer 204, to the top surface 218 of the first layer 202, yet the top surface 218 of the first layer 202 remains substantially planar, as originally formed.

Figure 3A:
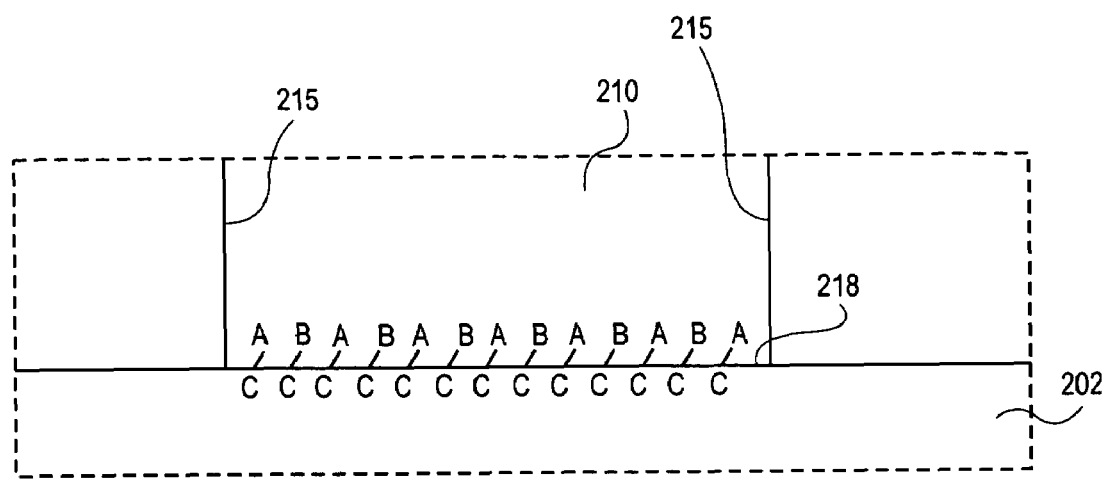
FIG. 3A-3C illustrate a method, according to one embodiment of the invention, of conditioning the top surface of the sensitive layer after the patterning material has been removed.
Figure 3B:
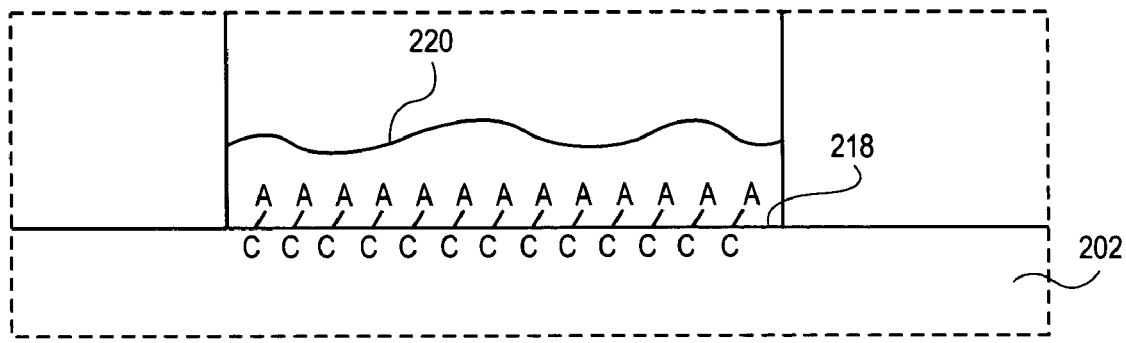
Figure 3C:
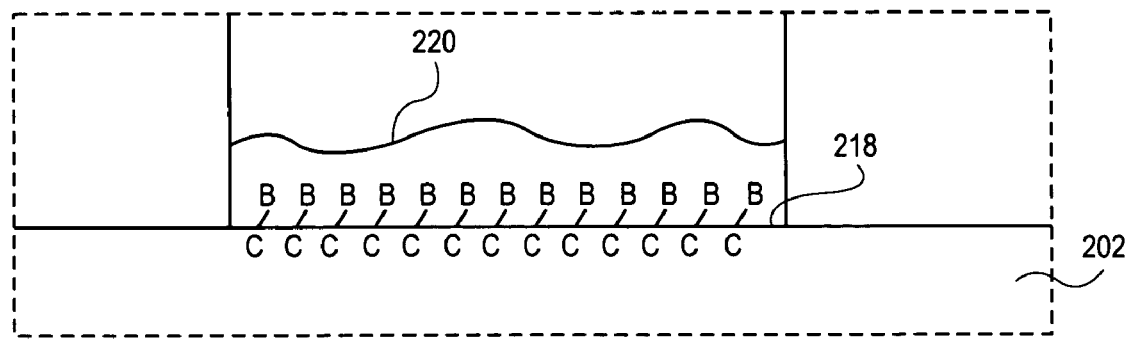

According to other embodiments of the invention, as shown in FIG. 3A-3C, after the via 210 has been formed completely through the second layer 204, the method may further include conditioning the top surface 218 of the first layer 202 with a third, or "conditioning" chemistry. The conditioning chemistry may cause the top surface 218 of the first layer 202 to have primarily the same atomic termini.

FIG. 3A illustrates an enlarged view of the top surface 218 of the first layer 202. The sidewalls 215 of the via 210 are shown for context. After the via 210 has been formed, the top surface 218 of the first layer 202 may consist of various types of atomic termini. For reference, these types of termini are shown in FIG. 3A-3C as either one of two types (type A or type B), however one skilled in the art may recognize that more than two types of termini may exist depending on how the first layer 202 was formed and also depending on the environment and/or chemicals that the top surface 218 of the first layer 202 had been exposed to at any point during its formation, or during subsequent processing, such as during the formation and patterning of the overlying second layer 204. The two types of atomic termini represent molecular endings that are attached, by molecular bonds, to the material of the first layer 202, represented by a molecular type C, and may be in a non-uniform pattern, as shown in FIG. 3A.

It would be desirable, however, in some circumstances, to have the top surface 218 comprise a single atomic termini (i.e., either type A or type B) depending on the composition of the material that will be subsequently formed atop the top surface 218. For example, certain materials may bond better to atoms of either type A or type B. Hence, for example, if a material is formed atop the top surface 218 of the first layer 202 that would bond better to a uniform layer of type A atoms, it would be advantageous to apply a conditioning chemical to the top of surface to make the surface comprise atoms that are primarily of type A atoms.

Therefore, referring to FIG. 3B, in one embodiment of the invention, a conditioning solution 220 may be applied to the top surface 218 of the first layer 202 that causes the atomic termini to be converted primarily to type A atoms. In a like manner, as shown in FIG. 3C, if atomic termini of type B atoms are desired, a different conditioning solution 222 may be applied to the surface of the first layer 202 that causes the atomic termini to be converted primarily to type B atoms.

Figure 4A:
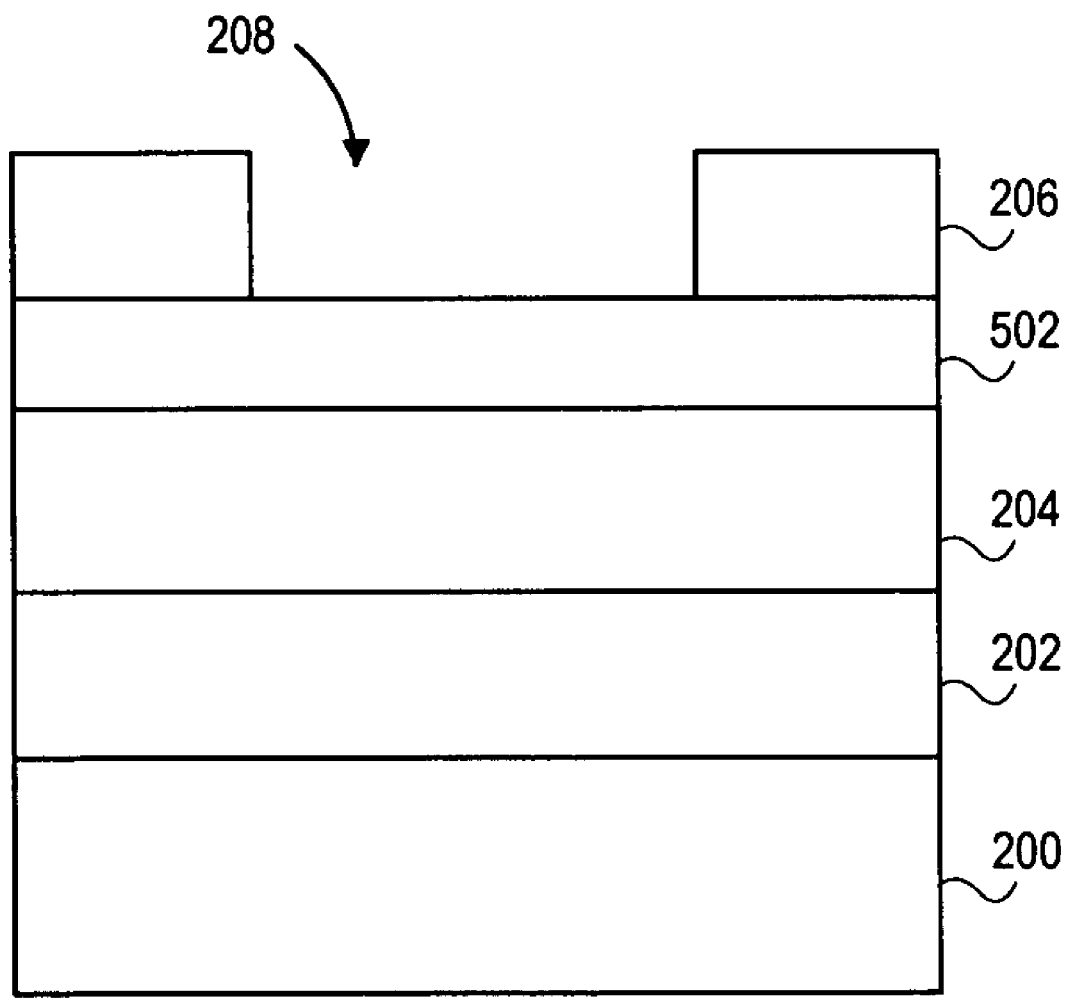
FIG. 4A-4D illustrate a method according to one embodiment of the invention, of removing a photoresist layer without damaging an underlying sensitive germanium layer.

FIG. 4A-4D illustrate a method according to one embodiment of the invention, of removing a photoresist layer without damaging an underlying sensitive germanium layer. Referring first to FIG. 4A, a germanium layer 202 is formed on substrate 200. Above the germanium layer 202 is formed a nitride layer 204 and an oxide layer 502. Above the oxide layer 502 is formed a photoresist layer 206. An opening 208 is formed into the photoresist layer 206 by well-known masking, exposing and developing techniques. The germanium layer 202 is a material that is sensitive to a harsh "photoresist-removal" chemistry (corresponding to the "first chemistry" described in conjuction with FIG. 2A-2D above). The photoresist-removal chemistry is to remove the photoresist layer 206 in a subsequent process, as described in conjunction with FIG. 4C below. The term "sensitive" means that the germanium layer 202 is easily etchable, removable, corruptible, or in other words, will undergo a severe material alteration if exposed directly to chemical compounds and/or solutions that comprise the photoresist-removal chemistry. Examples of the harsh photoresist-removal chemistry may include, but are not limited to, well known O2 plasma etching and "Pirahna" ash (i.e., >80% sulfuric acid mixture) including oxidizing agents (i.e., 1-20% nitric acid or hydrogen peroxide).

In one embodiment, the germanium layer 202 may be 500 nm thick, the nitride layer 204 may be 100 nm thick, the oxide layer 502 may be 500 nm thick, and the photoresist layer 206 may be 500 nm thick, however these thicknesses may vary slightly depending on the process. Nevertheless, since the nitride layer 204 directly overlies the sensitive germanium layer 202, the nitride layer 204 should be formed thick enough to protect the germanium layer 202 from the harsh, photoresist-removal chemistry that will be subsequently utilized.

Still referring to FIG. 4A, the oxide layer 502 is formed directly on top of the nitride layer 204. The oxide layer 502 can act as an interlayer dielectric in a device with metalization or as optical cladding for a waveguide.

Still referring to FIG. 4A, the photoresist layer 206 is formed to protect portions of the oxide layer 502 and nitride layer 204 from being etched during a photolithography process. Photolithography processes are well known in the art and may include the steps including (1) positioning a patterned hardmask above the photoresist layer 206 with the hardmask having a pattern, (2) directing electromagnetic energy through the pattern of the hardmask so that the photoresist material is exposed, then, once exposed, (3) developing the photoresist material to cause the exposed photoresist material to dissolve, hence forming the opening 208.

Figure 4B:
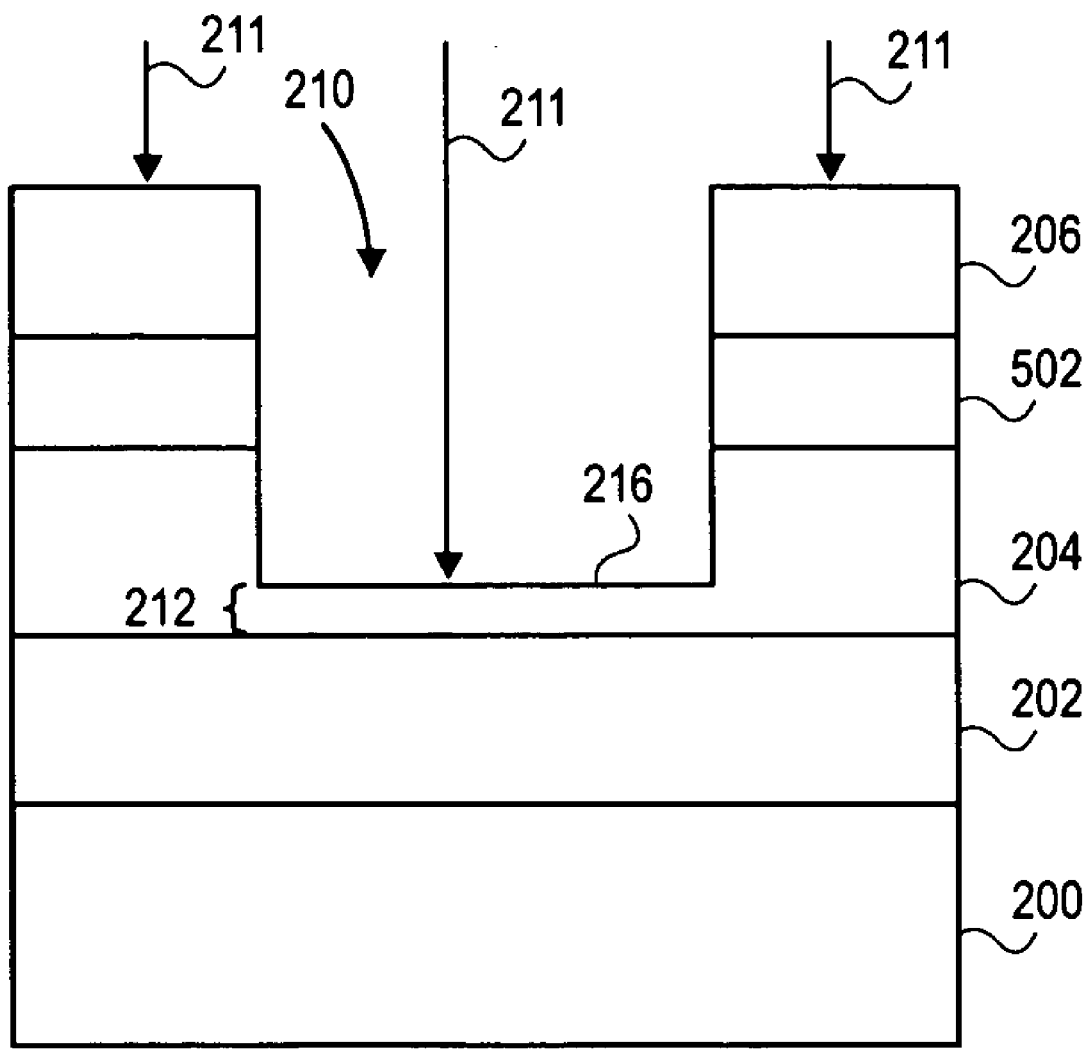

Next, as shown in FIG. 4B, the method continues with etching the oxide layer 502 and the nitride layer 204 directly through the opening 208, in a vertical fashion, such as with a reactive ion etch process. Reactive ion etching (RIE), an example of plasma etching, is a well known procedure that includes forming a plasma, within a reactive chamber, by igniting a gas having a particular chemistry, to form ions 211 comprising the particular chemistry. The ions 211 are then forced towards the water substrate, by the sheath electric field, causing etching of the surfaces that are exposed to the forceful ions 211. Depending on the particular chemistry, however, different surfaces are etched at different rates. As shown in FIG. 4B, ions 211 are formed of a chemistry that will remove either the oxide layer 502, the nitride layer 204, or both. Typically, however, the oxide layer 502 and the nitride layer 204 are etched utilizing two different etches with two different chemistries. For example, in one embodiment of the invention, the oxide layer 502 may be etched utilizing an oxide-etch chemistry (i.e., $CO/C_4F_8/O_2/Ar$) selective to the nitride layer, while the nitride layer 204 may be etched utilizing a nitride-etch chemistry ($CH_2F_2/O_2/Ar$). In comparison to the method described in conjunction with FIGS. 2A-2D above, the oxide layer 502 and the nitride layer 204 may correspond to the "second layer" 204.

Still referring to FIG. 4B, the oxide layer 502 is completely etched according to the pattern of the opening 208 in the photoresist layer 206. Then, the nitride layer 204 is etched, also according to the pattern of the opening 208. However, the nitride layer 204 is etched according to a timed etch so that a thin portion of the nitride layer 204, or "buffer layer" 212 remains unetched. Thus, a hole, or via 210, is formed having sidewalls 215 and a bottom 216. The buffer layer 212 has a thickness extending between the bottom 216 of the via 210 and the top surface 218 of the germanium layer 202. The buffer layer 212 is to function as a buffer between the bottom 216 of the via 210 and the top surface 218 of the germanium layer 202, during the subsequent removal of the photoresist layer 206. The buffer layer 212 shown in FIG. 4B may correspond to the buffer layer 212 described in conjunction with FIGS. 2A-2D above.

The timed etch is calculated to remove approximately 75%-90% of the nitride layer 204, hence causing the buffer layer 212 to be approximately 10% to 25% of the original thickness of the nitride layer 204. The thickness of the buffer layer 212 should not be less than about 10% because of thickness non-uniformities that may result when forming the buffer layer 212. In other words, because the buffer layer 212 may not have a uniform thickness, to ensure that it protects the underlying germanium layer 202 from the harsh photoresist-removal chemistry, it is advantageous to time the etch so that, at most, about 90% of the nitride layer 204's original thickness is etched.

Likewise, the thickness of the buffer layer 212 should not be more than about 25% of the original thickness of the nitride layer 204 so that the buffer layer 212 can subsequently be removed without too much effort. More specifically, as shown in conjunction with FIG. 4D below, the buffer layer 212 eventually must be removed. To minimize damage to the germanium layer 202 below, however, the buffer layer 212 should be removed cautiously, with a slower etch rate, by utilizing either a more dilute chemistry or by etching more slowly. Thus, by limiting the thickness of the buffer layer 212 to at most about 25% of the original thickness of the nitride layer 204, the buffer layer 212 can be removed slowly, yet still not take an excessively long time.

Figure 4C:
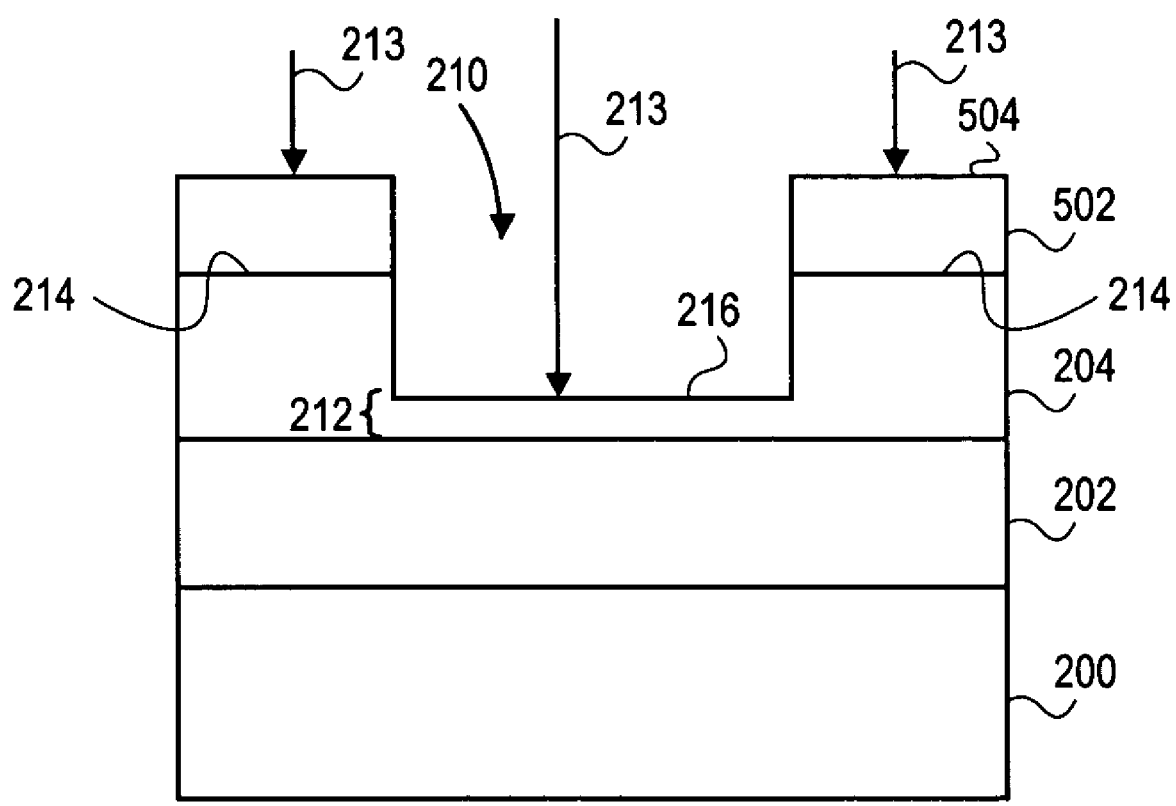

Next, as shown in FIG. 4C, the method continues with removing the photoresist layer 206 using the previously mentioned photoresist-removal chemistry. Examples of the harsh photoresist-removal chemistry may include, but are not limited to, well known $O_2$ plasma etching and "Pirahna" ash (i.e., >80% sulfuric acid mixture) including oxidizing agents (i.e., 1-20% nitric acid or hydrogen peroxide).

During the removal of the photoresist layer 206, the buffer layer 212 protects the germanium layer 202 from the photoresist-removal chemistry. If not for the buffer layer 212, the germanium layer 202 would be damaged by the harsh, photoresist-removal chemistry. However, because the buffer layer 212 is in place, the germanium layer 202 is spared from the potential damage that would occur from the photoresist-removal chemistry. In one embodiment of the invention, the photoresist-removal chemistry may be formulated to be selective to the nitride layer 204. Nonetheless, during the removal of the photoresist layer 206, the buffer layer 212 may still undergo some partial etching from the photoresist-removal chemistry. Hence, the thickness of the buffer layer 212 should be thick enough to withstand partial etching, yet still have a substantial portion of mass to still protect the germanium layer 202 throughout the entire time that the photoresist layer 206 is being removed, including any wet cleaning/ashing procedures. Therefore, because of partial etching that may occur from the photoresist-removal chemistry, it is advantageous to limit the minimum thickness of the buffer layer 212 to no less than about 10% of the original thickness of the nitride layer. If, however, 10% of the original thickness of the nitride layer would not be sufficient to maintain an integral buffer layer 212, the buffer layer 212 should consequently be formed thicker than 10%.

Figure 4D:
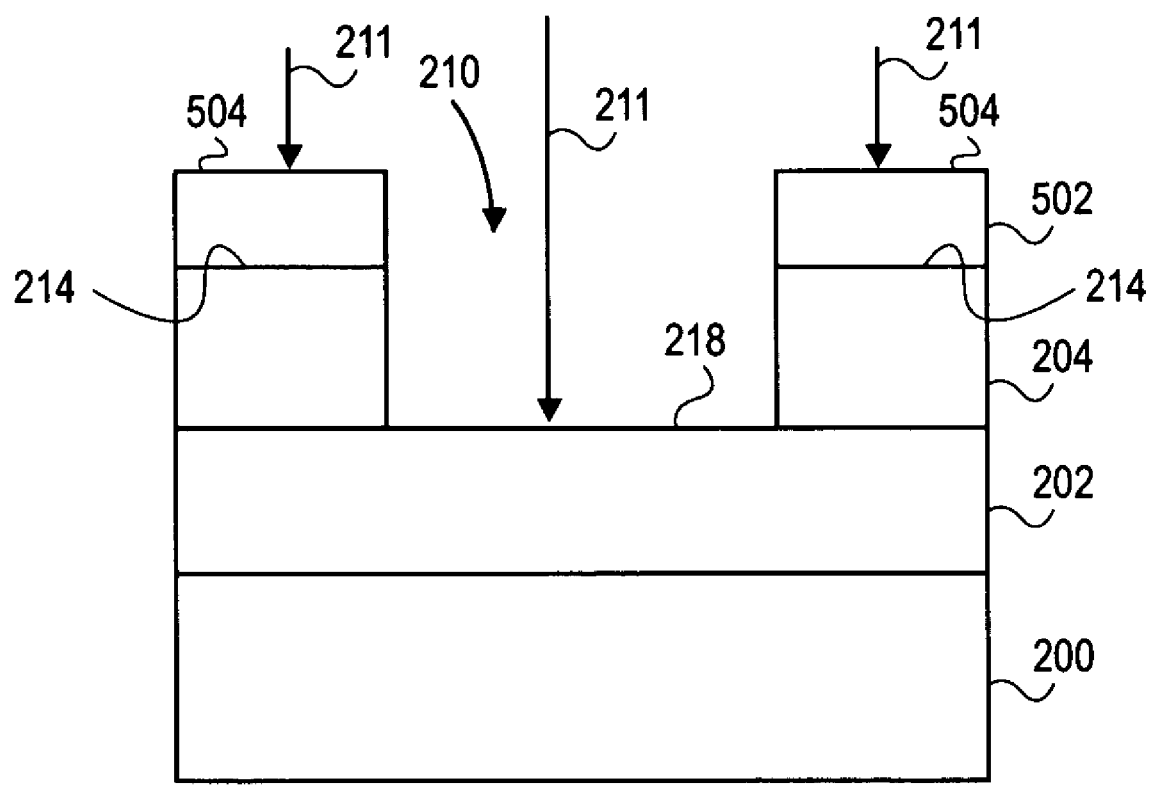

Next, as shown in FIG. 4D, after the photoresist layer 206 has been removed and cleaned, the method continues with removing the buffer layer 212 with a chemistry to which the germanium layer 202 is not significantly sensitive. As a result, the germanium layer 202 can maintain its substantially planar shape, as originally formed. In one embodiment of the invention, the buffer layer 212 may be removed by the same nitride-etch chemistry previously used to etch the nitride layer 204, as described above in conjunction with FIG. 4B. In addition to using the nitride-etch chemistry, to which the germanium layer 202 is not significantly sensitive, the removal of the buffer layer 212 may be performed very slowly, in a very controlled fashion, to better control the removal of the buffer layer 212 and ensure that the top surface 218 of the germanium layer 202 is not damaged. Hence, removal of the buffer layer 212 may include performing a reactive ion etch at a lower energy that is approximately 50% lower than the RIE of FIG. 4B, and/or performing an etch with a weaker nitride-etch chemistry that is approximately 50% more dilute than that used in conjunction with FIG. 4B.

Additionally, a wet chemistry may be employed to clean any remaining residue of the nitride layer 204. To minimize the impact of the wet cleaning chemistry on the germanium layer 202 the wet clean may be performed at room temperature, in very dilute concentrations, and for very brief periods of time. Consequently, the via 210 is extended entirely through the nitride layer 204, to the top surface 218 of the germanium layer 202, yet the top surface 218 of the germanium layer 202 remains substantially planar, as originally formed. It is highly advantageous for the top surface 218 of the germanium layer 202 to have orthogonality, or in other words, planarity, to ensure the proper functioning of the photodector device.

Still referring to FIG. 4D, it should be noted that during the removal of the buffer layer 212, without the presence of the photoresist layer 206, the nitride-etch chemistry may cause the top surface 504 of the oxide layer 502 to undergo some slight etching. For example, given the nitride-etch and oxide-etch chemistries above, a selectivity to the oxide layer 502 may be about 7:2. Thus, the loss to the oxide layer 502 may be approximately 3%-7% (i.e., (10%-25% nitride thickness)×(2/7)) during the nitride buffer layer 212 etch. Therefore, referring momentarily back to FIG. 5A, when the oxide layer 502 is formed, according to one embodiment of the invention, it may be formed thicker than necessary to compensate for the loss during the etch of the buffer layer 212, or more specifically, about 3%-7% thicker than necessary given a 7:2 selectivity. More generally, for a selectivity of $X_{nitride}:Y_{oxide}$ the oxide layer 502 may be formed thicker than intended to an additional degree of Y/X×(10%-25%).

Figure 5A:
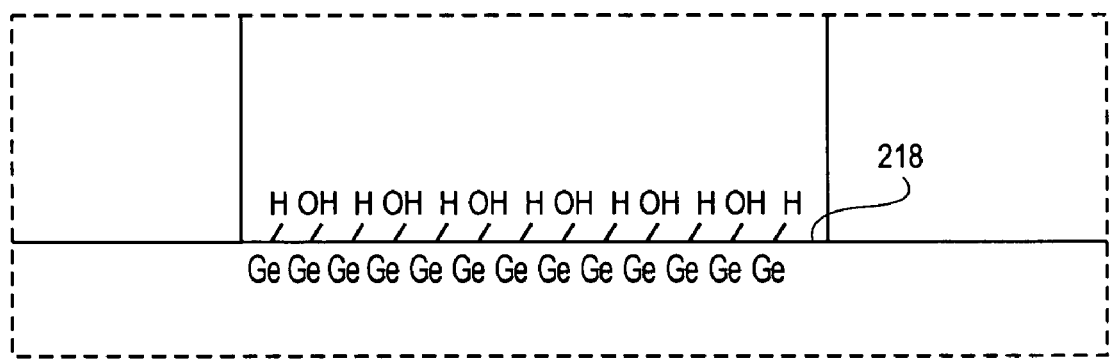
FIG. 5A-5C a method, according to one embodiment of the invention, of conditioning the top surface of the sensitive germanium layer after the photoresist layer has been removed.
Figure 5B:
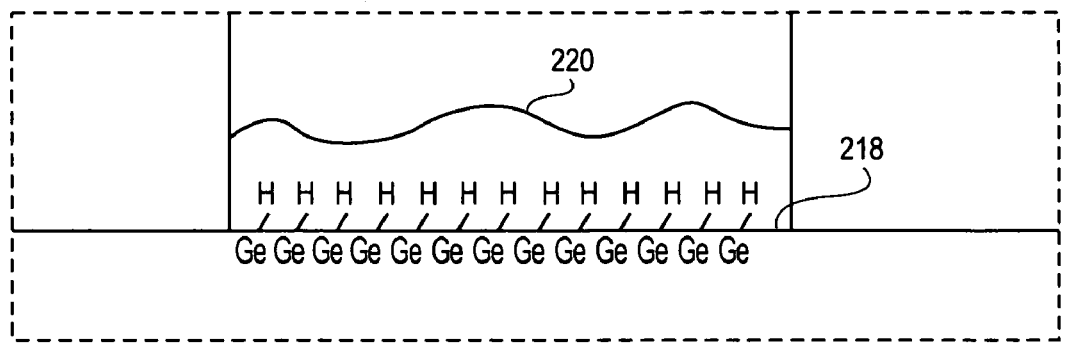
Figure 5C:
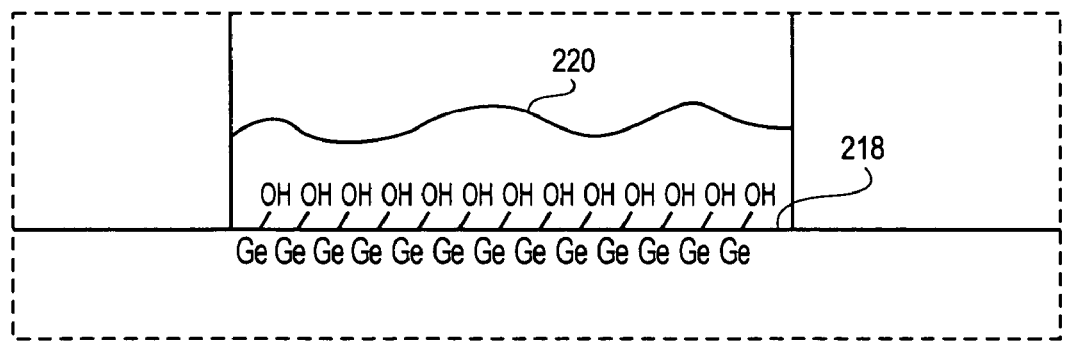

According to other embodiments of the invention, as shown in FIG. 5A-5C, after the via 210 has been formed completely through the nitride layer 204, the method may further include conditioning the top surface 218 of the germanium layer 202 with a "conditioning" chemistry. The "conditioning" chemistry may correspond to the "third" chemistry described in conjunction with FIG. 3A-3C above. The conditioning chemistry may cause the top surface 218 of the germanium layer 202 to have primarily the same atomic termini.

FIG. 5A illustrates an enlarged view of the top surface 218 of the germanium layer 202. After the via 210 has been formed, the top surface 218 may consist of various types of atomic termini. For reference, these types of termini are shown in FIG. 3A-3C as either hyride ("H") or hydroxal ("OH") termini. The amount and consistency of the H or OH termini depends on how the germanium layer 202 was formed and on the environment and/or chemicals that the top surface 218 of the germanium layer 202 had been exposed to at any point during its formation, or during subsequent processing, such as during the formation and patterning of the overlying nitride layer 204. The H atomic termini represent hydride molecular endings that are attached, by molecular bonds, to the germanium ("Ge") molecules comprising the material of the germanium layer 202. The OH atomic termini represent hydroxal molecular endings attached, by molecular bonds, to the Ge molecules. The H and OH termini therefore represent ligants of G-H molecules and G-OH molecules, repectively, as shown in FIG. 5A.

It would be desirable, however, in some circumstances, to have the top surface 218 primarily consist of a single atomic termini (i.e., either H or OH) depending on the composition of the material that will be subsequently formed atop the top surface 218. For example, certain materials may bond better to either H or OH termini, or may create a more natural transition between materials based on the atomic characteristics of either H or OH atomic termini. For example, hydride termini have a low resistivity and therefore may be useful for making good contact with, or transitioning to, other low-resistive materials, such as metals or other conductive materials. On the other hand, hydroxyl termini have a high resistivity and may be useful for making good contact with, or transitioning to, dielectric materials. Furthermore, hydrides are hydrophobic while hydroxyls are hydrophilic. Therefore depending on the application, hydroxyls may be preferable to hydrides. For example, hydroxyls are useful for atomic layer deposition (ALD) processes such as used for the deposition of some high-k dielectric films. The ALD process is more beneficial when applied to a hydrophilic layer, as opposed to a hydrophobic layer when halide precursors are used.

Therefore, referring to FIG. 5B, in one embodiment of the invention, a conditioning solution 220 may be applied to the top surface 218 of the germanium layer 202 that causes the atomic termini to be converted primarily to hydride atomic termini. Conditioning solution 220 may be an aqueous solution of range 0.1%-2% hyrdrofluoric acid, optimized at 1%. In a like manner, as shown in FIG. 5C, if hyroxal atomic termini are desired, a different conditioning solution 222 may be applied to the surface of the germanium layer 202 that causes the atomic termini to be converted primarily to OH termini. Conditioning solution 222 may be an aqueous solution of range 1%-29% ammonium hydroxide, optimized at 5%.

Several embodiments of the invention have thus been described. However, those ordinarily skilled in the art will recognize that the invention is not limited to the embodiments described, but can be practiced with modification and alteration within the spirit and scope of the appended claims that follow.

What is claimed:

1. A method, comprising:
    forming a germanium layer on a semiconductor substrate;
    forming a nitride layer on the germanium layer;
    forming an oxide on the nitride layer;
    forming a photoresist layer on the oxide layer;
    patterning the photoresist layer to have an opening;
    performing a first etch to the oxide layer through the opening with a first chemistry;
    performing a second etch to the nitride layer through the opening with a second chemistry, the second etch being a timed dry etch that etches through about 75% to about 90% of the nitride layer with a second chemistry, to produce a protective nitride buffer over the germanium layer, the protective nitride buffer being about 10% to about 25% of an original thickness of the nitride layer;
    removing the photoresist layer with a third chemistry to which the germanium layer is sensitive, the protective nitride buffer protecting the underlying germanium layer from the third chemistry;
    performing a third etch to the protective nitride buffer, the third etch being a timed etch that etches through the approximate 10% to 25% of the nitride layer that was not previously etched in the second etch; and
    wet cleaning a surface of the germanium layer with a fourth chemistry that cleans the surface and conditions the atomic termini of the surface to be primarily either hydrophobic or hydrophilic.

2. The method of claim 1, wherein the first chemistry is $CO/C_4F_8/O_2/Ar$, the second chemistry is $CH_2F_2/O_2/Ar$, the third chemistry includes an $O_2$ plasma and a sulfuric acid mixture with an oxidizing agent.

3. The method of claim 1, wherein the fourth chemistry is any one of vapor hydrofluorine (HF), vapor hydrochlorine (HCl), aqueous ultra-dilute HF, 1-29% ammonium hydroxide aqueous solution, or 0.1-2% hydrofluoric acid.

4. The method of claim 1, wherein wet cleaning of the germanium surface is performed at room temperature in dilute 0.1-10% by volume concentrations for a brief period of time 0.5-10 minutes.

5. The method of claim 1, wherein the third etch removes a portion of the oxide layer as the protective nitride buffer is being etched, hence the method also including forming the oxide layer thicker than necessary to compensate for removed portion.

6. The method of claim 1, wherein performing a first etch to the oxide layer through the opening with the first chemistry comprises dry etching.

7. The method of claim 6, wherein dry etching comprises plasma etching.

8. The method of claim 7, wherein plasma etching comprises reactive ion etching.

9. The method of claim 1, wherein performing a second etch to the nitride layer through the opening comprises plasma etching.

10. The method of claim 9, wherein plasma etching comprises reactive ion etching.

11. The method of claim 1, wherein removing the photoresist layer with a third chemistry comprises partially etching the protective nitride buffer.

12. The method of claim 11, wherein the original thickness of the nitride layer is non-uniform.

13. The method of claim 1, wherein the oxide layer is further characterized as an interlayer dielectric in a device with metallization.

14. The method of claim 1, wherein the oxide layer is further characterized as an optical cladding for a waveguide.

* * * * *